US011355051B2

(12) United States Patent
Shen et al.

(10) Patent No.: US 11,355,051 B2
(45) Date of Patent: Jun. 7, 2022

(54) DISPLAY DEVICE, DISPLAY PANEL, AND PIXEL DRIVE CIRCUIT OF DISPLAY PANEL

(71) Applicant: Kunshan Go-Visionox Opto-Electronics Co., Ltd., Jiangsu (CN)

(72) Inventors: Zhihua Shen, Jiangsu (CN); Lu Zhang, Jiangsu (CN); Jianlong Wu, Jiangsu (CN); Siming Hu, Jiangsu (CN)

(73) Assignee: KUNSHAN GO-VISIONOX OPTO-ECTRONICS CO., LTD, Jiangsu (CN)

( * ) Notice: Subject to any disclaimer, the term of this patent is extended or adjusted under 35 U.S.C. 154(b) by 0 days.

(21) Appl. No.: 17/320,990

(22) Filed: May 14, 2021

(65) Prior Publication Data
US 2021/0272499 A1 Sep. 2, 2021

Related U.S. Application Data

(63) Continuation of application No. PCT/CN2019/107913, filed on Sep. 25, 2019.

(30) Foreign Application Priority Data

Mar. 29, 2019 (CN) .......................... 201910250976.7

(51) Int. Cl.
G09G 3/20 (2006.01)
G09G 3/3233 (2016.01)
(Continued)

(52) U.S. Cl.
CPC ......... G09G 3/2003 (2013.01); G09G 3/3233 (2013.01); G09G 3/3266 (2013.01);
(Continued)

(58) Field of Classification Search
CPC .. G09G 3/2003; G09G 3/3208; G09G 3/3233; G09G 3/3266; G09G 3/3291;
(Continued)

(56) References Cited

U.S. PATENT DOCUMENTS

2005/0140260 A1 6/2005 Park et al.
2008/0090403 A1* 4/2008 Schlangen ........ H01L 21/76898
438/599
(Continued)

FOREIGN PATENT DOCUMENTS

CN 1638563 A 7/2005
CN 101578648 A 11/2009
(Continued)

OTHER PUBLICATIONS

Chinese First Office Action 100191 (CN Application No. 201910250976.7) with English Translation, dated May 6, 2020, 32 pages.
(Continued)

*Primary Examiner* — Stacy Khoo
(74) *Attorney, Agent, or Firm* — Adsero IP

(57) ABSTRACT

The present disclosure provides a display device and a display panel thereof, and a pixel drive circuit of a display panel. By changing a width-to-length ratio of a drive transistor in the pixel drive circuit of each sub-pixel, or changing a capacitance of a storage capacitor at the same time, such that: under the same gray scale, the width-to-length ratio of a drive transistor of each sub-pixel in same color is in direct proportion to a drive current; or at the same time a charging saturation of a storage capacitor of each sub-pixel in same color is the same, and the capacitance of the storage capacitor of each sub-pixel in same color is in direct proportion to the drive current, and the charging saturation is a difference value between an actual charging voltage and a theoretical charging voltage of the storage capacitor when a charging phase ends.

18 Claims, 12 Drawing Sheets

(51) Int. Cl.
*G09G 3/3266* (2016.01)
*G09G 3/3291* (2016.01)
*H01L 27/32* (2006.01)

(52) U.S. Cl.
CPC ....... *G09G 3/3291* (2013.01); *H01L 27/3262* (2013.01); *H01L 27/3276* (2013.01); *H01L 27/3281* (2013.01); *G09G 2300/0443* (2013.01); *G09G 2300/0809* (2013.01); *G09G 2300/0842* (2013.01); *G09G 2310/027* (2013.01); *G09G 2360/14* (2013.01)

(58) Field of Classification Search
CPC ... G09G 2300/0426; G09G 2300/0443; G09G 2300/0809; G09G 2300/0842; G09G 2310/0216; G09G 2310/0251; G09G 2310/027; G09G 2360/14; H01L 27/32; H01L 27/3262; H01L 27/3276; H01L 27/3281; H01L 27/3244
See application file for complete search history.

(56) References Cited

U.S. PATENT DOCUMENTS

| | | |
|---|---|---|
| 2010/0045646 A1 | 2/2010 | Kishi |
| 2016/0343787 A1 | 11/2016 | Wu |
| 2018/0182286 A1 | 6/2018 | Ahmed et al. |
| 2018/0348561 A1 | 12/2018 | Umezaki et al. |
| 2019/0311674 A1* | 10/2019 | Shin .................... H01L 27/3227 |
| 2019/0362672 A1 | 11/2019 | Cui et al. |
| 2020/0302863 A1 | 9/2020 | Xuan et al. |

FOREIGN PATENT DOCUMENTS

| | | |
|---|---|---|
| CN | 102290027 A | 12/2011 |
| CN | 103646629 A | 3/2014 |
| CN | 104037173 A | 9/2014 |
| CN | 104536179 A | 4/2015 |
| CN | 104898337 A | 9/2015 |
| CN | 105702210 A | 6/2016 |
| CN | 106709866 A | 5/2017 |
| CN | 107038997 A | 8/2017 |
| CN | 108269840 A | 7/2018 |
| CN | 108538206 A | 9/2018 |
| CN | 109036283 A | 12/2018 |
| CN | 109272932 A | 1/2019 |

OTHER PUBLICATIONS

Chinese Second Office Action 100191 (CN Application No. 201910250976.7) with English Translation, dated Jun. 16, 2020, 18 pages.
International Search Report (International Application No. PCT/CN2019/107913) English Translation, dated Dec. 27, 2019, 11 pages.

* cited by examiner

DISPLAY DEVICE, DISPLAY PANEL, AND PIXEL DRIVE CIRCUIT OF DISPLAY PANEL

CROSS REFERENCE TO RELATED APPLICATIONS

The present application is a continuation application of the PCT application No. PCT/CN2019/107913, filed on Sep. 25, 2019, which claims priority to Chinese Patent Application No. 2019102509767, filed on Mar. 29, 2019, and the contents of the both applications are herein incorporated by reference in their entirety.

TECHNICAL FIELD

The present disclosure relates to the technical field of display devices, and particularly to a display device, a display panel, and a pixel drive circuit of a display panel.

BACKGROUND

With the rapid development of display devices, users have increasingly higher requirements for a proportion of a display screen. Since components such as a camera, a sensor, an earpiece, etc., usually need to be mounted in an upper portion of a display screen of a mobile terminal, a part of the upper portion of the display screen is usually reserved for mounting the above components in a notch design scheme adopted in the prior art, which affects the overall consistency of the display screen, so that a full-screen display has received more and more attention from the industry.

SUMMARY

An objective of the present disclosure is to provide a display device and a display panel thereof, and a pixel drive circuit of a display panel for a full-screen display.

Advantages of the present disclosure are as follows.

1) For a pixel drive circuit in which a sampling transistor and a drive transistor are not short-circuited as diodes in any working phase, a width-to-length ratio of a drive transistor in a pixel drive circuit of each sub-pixel is changed, such that under the same gray scale, the width-to-length ratio of the drive transistor of each sub-pixel in same color is in direct proportion to the drive current.

For a pixel drive circuit in which the sampling transistor and/or the drive transistor are short-circuited as diodes in a working phase, and the sampling transistor and the drive transistor are not the same transistor, a width-to-length ratio of a drive transistor in a pixel drive circuit of each sub-pixel is changed, such that under the same gray scale, the width-to-length ratio of the drive transistor of each sub-pixel in same color is in direct proportion to the drive current.

For a pixel drive circuit in which the sampling transistor and/or the drive transistor are short-circuited as diodes in a working phase, and the sampling transistor and the drive transistor are the same transistor, a width-to-length ratio of a drive transistor and a capacitance of a storage capacitor in a pixel drive circuit of each sub-pixel are changed, such that under the same gray scale, a charging saturation of a storage capacitor of each sub-pixel in same color is the same, a width-to-length ratio of a drive transistor and a capacitance of a storage capacitor of each sub-pixel in same color are in direct proportion to the drive current; the charging saturation is a difference value between an actual charging voltage and a theoretical charging voltage of a storage capacitor when a charging phase ends.

The advantages are that: by configuring a product structure, the same data voltage can be applied to each sub-pixel in same color, and the drive current flowing through each sub-pixel in same color can achieve a display effect of uniform brightness, thereby avoiding a large number of calculations caused by obtaining a data voltage that makes a uniform brightness for different pixels at different moments in a process of Gamma adjustment, and reducing requirements on drive capability of the driver chip.

DETAILED DESCRIPTION

In order to make the above objectives, features and advantages more apparent and easier to understand, specific embodiments of the present disclosure are detailed below with reference to accompanying drawings.

Figure 1:
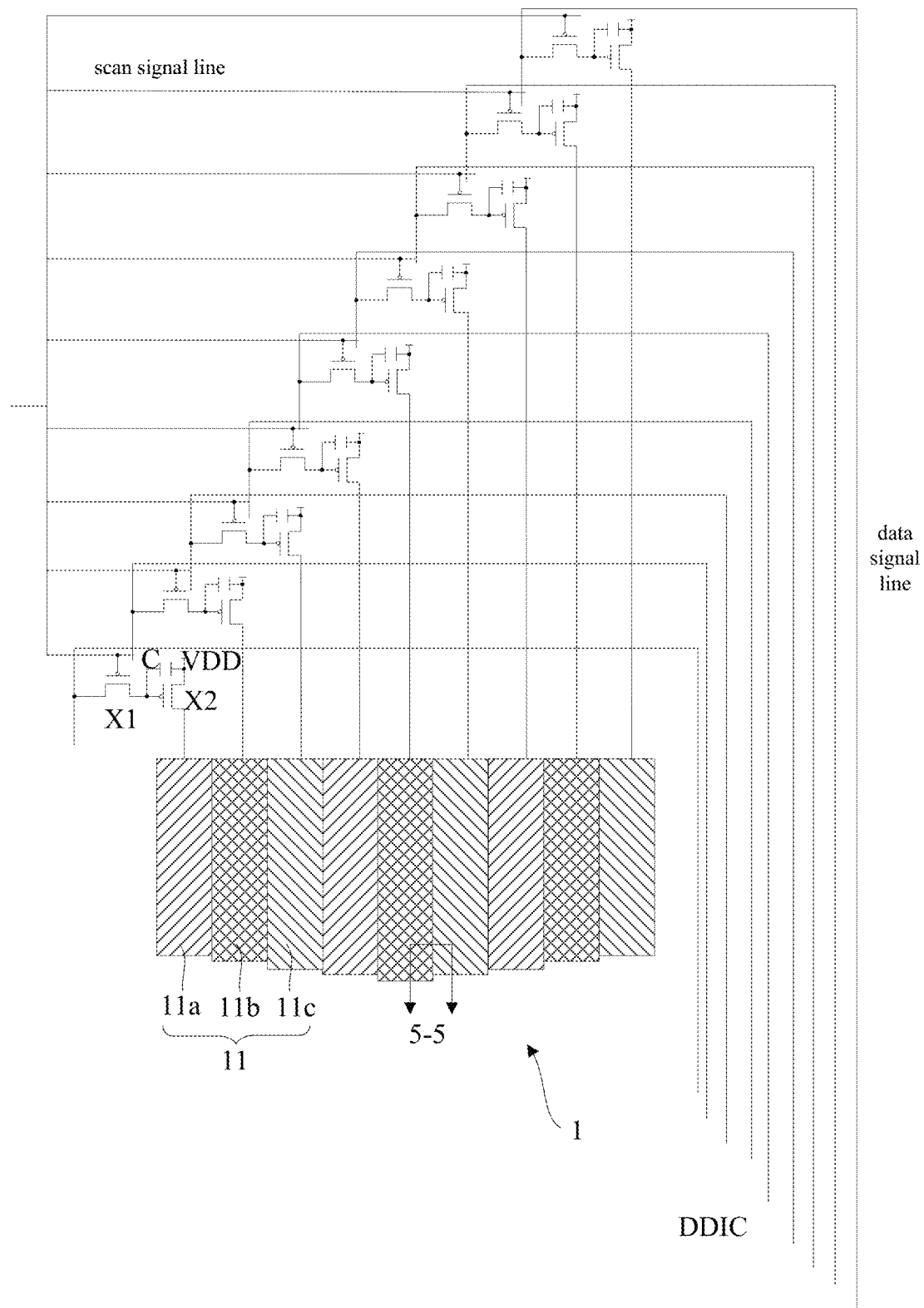
FIG. 1 is a top view of a display panel according to an embodiment of the present disclosure.

Referring to FIG. 1, the display panel 1 includes a plurality of array pixel units 11. Each pixel unit 11 includes a plurality of sub-pixels (11a, 11b, 11c). A pixel drive circuit of each of the sub-pixels (11a, 11b, 11c) includes a sampling transistor X1, a drive transistor X2, and a storage capacitor C. The sampling transistor X1 is configured to collect a data signal voltage Vdata and hold the collected data signal voltage Vdata in the storage capacitor C. The drive transistor X2 is configured to receive a current supplied by a power line, and supply a drive current Ids to the sub-pixel (11a, 11b, 11c) according to the data signal voltage Vdata held by the storage capacitor C.

Under the same gray scale, a width-to-length ratio W/L of the drive transistor X2 of each sub-pixel in same color 11a/11b/11c is in direction proportion to the drive current Ids of the drive transistor X2.

Referring to FIG. 1, the pixel drive circuit has a 2T1C (formed by two Thin Film Transistors (TFT) and one capacitor) structure, and the sampling transistor X1 and the drive transistor X2 are not short-circuited as diodes in any working phase.

The voltage of the data signal collected by the sampling transistor X1 is Vdata.

In the light-emission phase, for a positive channel Metal Oxide Semiconductor (PMOS) drive transistor X2, a formula corresponding to the data voltage Vdata and the drive current Ids is as follows:

$$Ids = \frac{W}{2L} \cdot Cox \cdot \mu \cdot (Vsg - |Vth|)^2 = \frac{W}{2L} \cdot Cox \cdot \mu \cdot (VDD - Vdata - |Vth|)^2;$$

where, W is a channel width of the drive transistor; L is a channel length of the drive transistor; Cox is a capacitance constant, i.e., a channel capacitance per unit area of the drive transistor; μ is a carrier mobility, i.e., an average drift rate of carriers in the semiconductor under a unit electric field; VDD is a power supply voltage; Vsg is a source gate voltage; |Vth| is a threshold voltage of the drive transistor X2, which is a negative value.

According to the above formula, under the same gray scale, the width-to-length ratio W/L of the drive transistor X2 of each sub-pixel in same color 11a/11b/11c is in direct proportion to the drive current Ids of the drive transistor X2, that is, VDD−Vdata−|Vth| is a fixed value. Since the threshold voltages |Vth| and power supply voltages VDD of the driving transistors X2 corresponding to the sub-pixel in same colors 11a, 11b, 11c are the same, the data voltages Vdata of the sub-pixel in same colors 11a, 11b, 11c are also the same. In other words, for each sub-pixel in same color 11a/11b/11c, under the same data voltage Vdata, the same gray scale brightness can be achieved, and accordingly uniform brightness display can be achieved.

Figure 2:
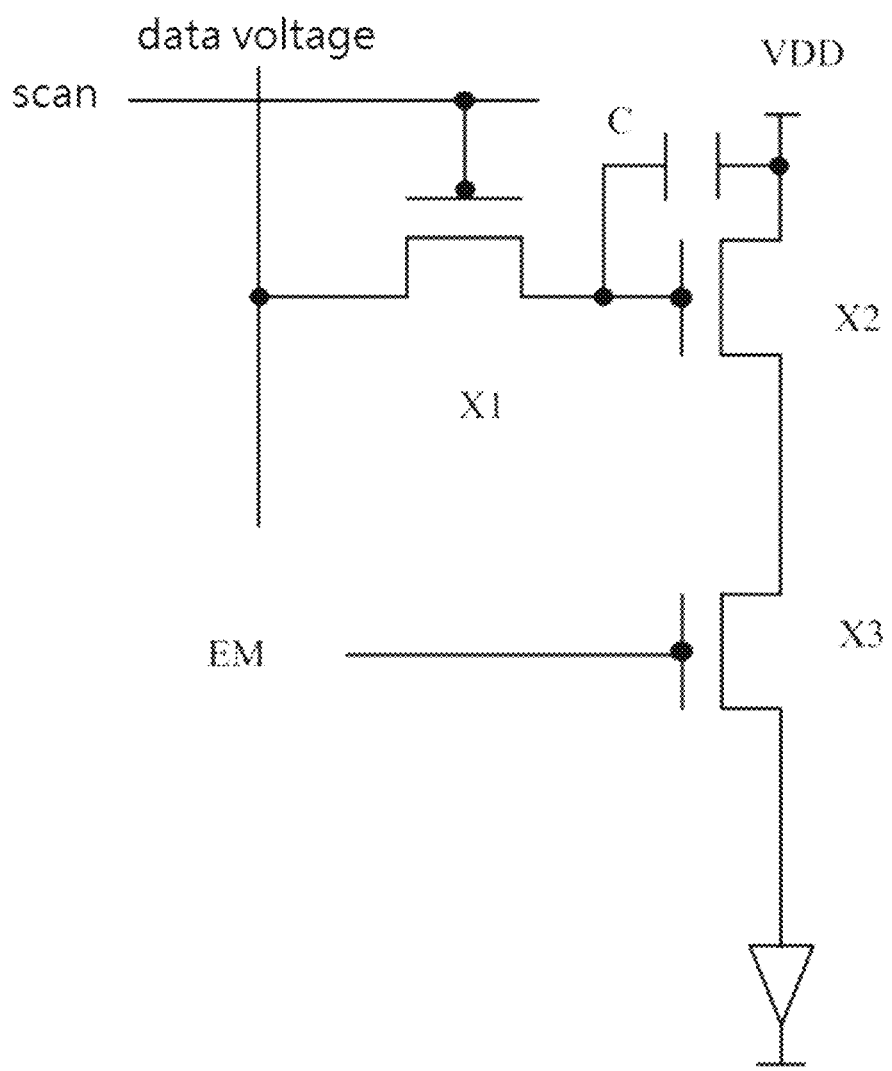
FIG. 2 is a circuit diagram of a pixel drive circuit of a display panel according to an embodiment of the present disclosure.

FIG. 2 is a circuit diagram of a pixel drive circuit of a display panel according to an embodiment of the present disclosure. It can be seen that the pixel drive circuit in FIG. 2 has a 3T1C structure. Referring to FIGS. 2 and 1, the 3T1C structure adds a light-emitting transistor X3 compared to the 2T1C structure, and the light-emitting transistor X3 is located between the drive transistor X2 and the sub-pixels (11a, 11b, 11c). The light-emitting transistor X3 is controlled by the light-emitting signal line EM.

In the 3T1C structure, under the same gray scale, the width-to-length ratio W/L of the drive transistor X2 of the sub-pixel in same colors (11a, 11b, 11c) is in direct proportion to the drive current Ids of the drive transistor X2

Figure 3:
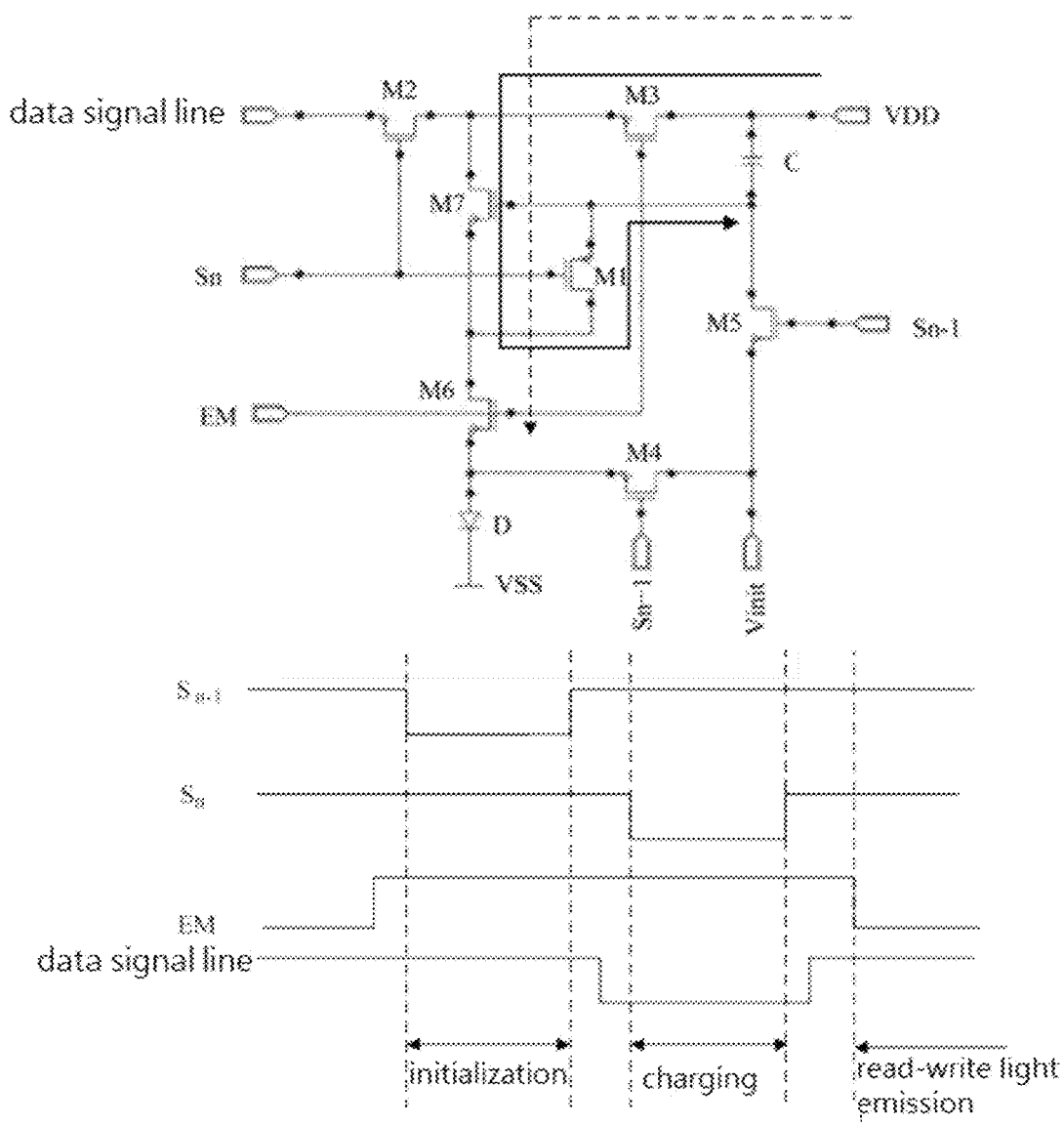
FIG. 3 is a circuit diagram and a corresponding working sequence diagram of another pixel drive circuit of a display panel according to an embodiment of the present disclosure.

FIG. 3 is a circuit diagram and a corresponding working sequence diagram of another pixel drive circuit of a display panel according to an embodiment of the present disclosure.

It can be seen that FIG. 3 shows a 7T1C structure. The pixel drive circuit includes: a first transistor M1, a second transistor M2, a third transistor M3, a fourth transistor M4, a fifth transistor M5, a sixth transistor M6, a seventh transistor M7, and a storage capacitor C.

A gate of the first transistor M1 is connected to a scan signal line Sn in a pixel row where an OLED sub-pixel D is located and a gate of the second transistor M2. A first electrode of the first transistor M1 is connected to a first electrode of the sixth transistor M6 and a second electrode of the seventh transistor M7. A second electrode of the first transistor M1 is connected to a gate of the seventh transistor M7 and a second electrode of the storage capacitor C.

A first electrode of the second transistor M2 is connected to a data signal line VData; and a second electrode of the second transistor M2 is connected to a first electrode of the seventh transistor M7 and a first electrode of the third transistor M3.

A gate of the third transistor M3 is connected to a gate of the sixth transistor M6; a first electrode of the third transistor M3 is connected to a first electrode of the seventh transistor M7; and a second electrode of the third transistor M3 is connected to a first electrode of the storage capacitor C.

A gate of the fourth transistor M4 is connected to a scan signal line Sn−1 in the previous pixel row; a first electrode of the fourth transistor M4 is connected to an anode of an OLED sub-pixel D; and a second electrode of the fourth transistor M4 and an initial voltage signal Vinit line are connected to a second electrode of the fifth transistor M5.

A gate of the fifth transistor M5 is connected to the scan signal line Sn−1 in the previous pixel row; a first electrode of the fifth transistor M5 is connected to the gate of the seventh transistor M7 and the second electrode of the storage capacitor C; and a second electrode of the fifth transistor M5 is connected to the initial voltage signal Vinit line.

A gate of the sixth transistor M6 is connected to the light-emitting signal line EM; a first electrode of the sixth transistor M6 is connected to the second electrode of the seventh transistor M7; and the second electrode of the sixth transistor M6 is connected to the first electrode of the fourth transistor M4.

The first electrode of the storage capacitor C is connected to the power signal line VDD.

The first electrode is one of the source or drain, and a second electrode is the other.

The working sequence of the pixel drive circuit of the 7T1C structure includes: an initialization phase, a charging phase, and a read-write light-emission phase.

In the initialization phase, the scan signal line Sn−1 in the previous row of the OLED sub-pixel D provides a low-voltage signal; the scan signal line Sn, the light-emitting signal line EM, and the data signal line VData in a row where the OLED sub-pixel is located provide high-voltage signals. At this moment, the fourth transistor M4 and the fifth transistor M5 are turned on, and a reference voltage is applied to the anode of the OLED sub-pixel D and the storage capacitor C, to provide a negative voltage for the anode of the OLED sub-pixel D, empty an internal pre-stored voltage and complete initialization.

In the charging phase, the scan signal line Sn−1 and the light-emitting signal line EM in the previous row of the OLED sub-pixel D provide high-voltage signals, and the scan signal line Sn and the data signal line VData in the row where the OLED sub-pixel D is located provide low-voltage signals. At this moment, as shown by black solid arrows in FIG. 3, the second transistor M2, the fifth transistor M5, and the seventh transistor M7 are turned on, and a difference between a voltage of the data signal line VData and the threshold voltage of the seventh transistor M7 is applied to the storage capacitor C to complete the charging process of the storage capacitor C.

In the read-write light-emission phase, the scan signal line Sn−1 in the previous row of the OLED sub-pixel D, the scan signal line Sn−1 and the data signal line VData in the previous row of the OLED sub-pixel D provide high-voltage signals; the light-emitting signal line EM provides a low-voltage signal. At this moment, as shown by the black dotted arrows in FIG. 3, the third transistor M3, the sixth transistor M6, and the seventh transistor M7 are turned on; and the power signal line VDD provides a drive voltage to the anode of the OLED sub-pixel D through the third transistor M3, the sixth transistor M6 and the seventh transistor M7 to make the OLED sub-pixel D emit light normally.

Compared to 2T1C, the 7T1C pixel circuit has a threshold voltage compensation process of the OLED sub-pixel D during the light emission period, and thus can ensure the uniformity of the light emission of the OLED sub-pixel D.

In the above 7T1C structure, the sampling transistor and the drive transistor are the same transistor, and both are the seventh transistor M7. A voltage of the data signal line VData collected by the sampling transistor M7 is equal to Vdata−|Vth|, and Vth is a threshold voltage of the seventh PMOS transistor M7.

As shown in FIG. 3, the drain and gate of the seventh transistor M7 are short-circuited during the charging phase, and the transistor M7 is changed into a diode.

Under the same gray scale, a charging saturation ΔU of the storage capacitor C of each sub-pixel in same color 11a/11b/11c is the same. The width-to-length ratio W/L of the drive transistor M7 of each sub-pixel in same color 11a/11b/11c and the capacitance of the storage capacitor C are both in direct proportion to the drive current Ids of the M7, the charging saturation ΔU is a difference value between an actual charging voltage and a theoretical charging voltage of the storage capacitor C when the charging phase ends.

The principle of the above scheme is that:
in the light-emission phase, for the PMOS drive transistor M7, a formula corresponding to the data voltage Vdata and the drive current Ids is as follows:

$$Ids = \frac{W}{2L} \cdot Cox \cdot \mu \cdot (Vsg - |Vth|)^2 = \frac{W}{2L} \cdot Cox \cdot \mu \cdot (VDD - Vgate - |Vth|)^2 = \frac{W}{2L} \cdot Cox \cdot \mu \cdot (VDD - Vdata + \Delta U)^2;$$

where ΔU=Vdata−|Vth|−Vgate; Vgate is the actual charging voltage of the storage capacitor when the charging phase ends; Vdata−|Vth| is the theoretical charging voltage of storage capacitor when the charging phase ends; Cox is the capacitance constant, i.e., the channel capacitance per unit area of the drive transistor; μ is the carrier mobility, i.e., the average drift rate of carriers in the semiconductor under a unit electric field; VDD is the power supply voltage; ΔU is the charging saturation of the storage capacitor C; W is the channel width of the drive transistor; L is the channel length of the drive transistor.

According to the above formula, under the same gray scale, the width-to-length ratio W/L of the drive transistor M7 of each sub-pixel in same color 11a/11b/11c is in direct proportion to the drive current Ids of the M7, that is, VDD−Vdata+ΔU is a fixed value. Due to the same power supply voltage VDD, in order to make the data voltage Vdata of each sub-pixel in same color 11a/11b/11c be the same, i.e., in order to achieve the same grayscale brightness under the same data voltage Vdata, the charging saturation ΔU of the storage capacitor C of each sub-pixel in same color 11a/11b/11c can be controlled to be the same.

Because ΔV=Vgate−Vinit, where ΔV is the charging voltage of the storage capacitor C during the charging phase, and Vinit is an initial voltage applied to the storage capacitor C during the initialization phase.

By combining with ΔU=Vdata−|Vth|−Vgate and eliminating Vgate, a following equation is obtained: ΔV+ΔU=Vdata−|Vth|−Vinit.

It can be seen that since the threshold voltage |Vth| of each sub-pixel in same color 11a/11b/11c is the same and Vinit is the same, the same charging saturation ΔU of the storage capacitor C can be implemented by controlling the charging voltage of the storage capacitor C of each sub-pixel in same color 11a/11b/11c during the charging phase to be the same.

$$\Delta V = \frac{Q}{Cst} = \frac{\int_0^{t_0} Ids \cdot dt}{Cst};$$

However, Q is an electric quantity charged by the storage capacitor C during the charging phase, $t_0$ is a time duration of the charging phase, and Cst is the capacitance of the storage capacitor C.

It can be seen that when the storage capacitor C of each sub-pixel in same color 11a/11b/11c has the same charging voltage ΔV during the charging phase, the capacitance of the storage capacitor C is in direction proportion to the drive current Ids.

Figure 4:
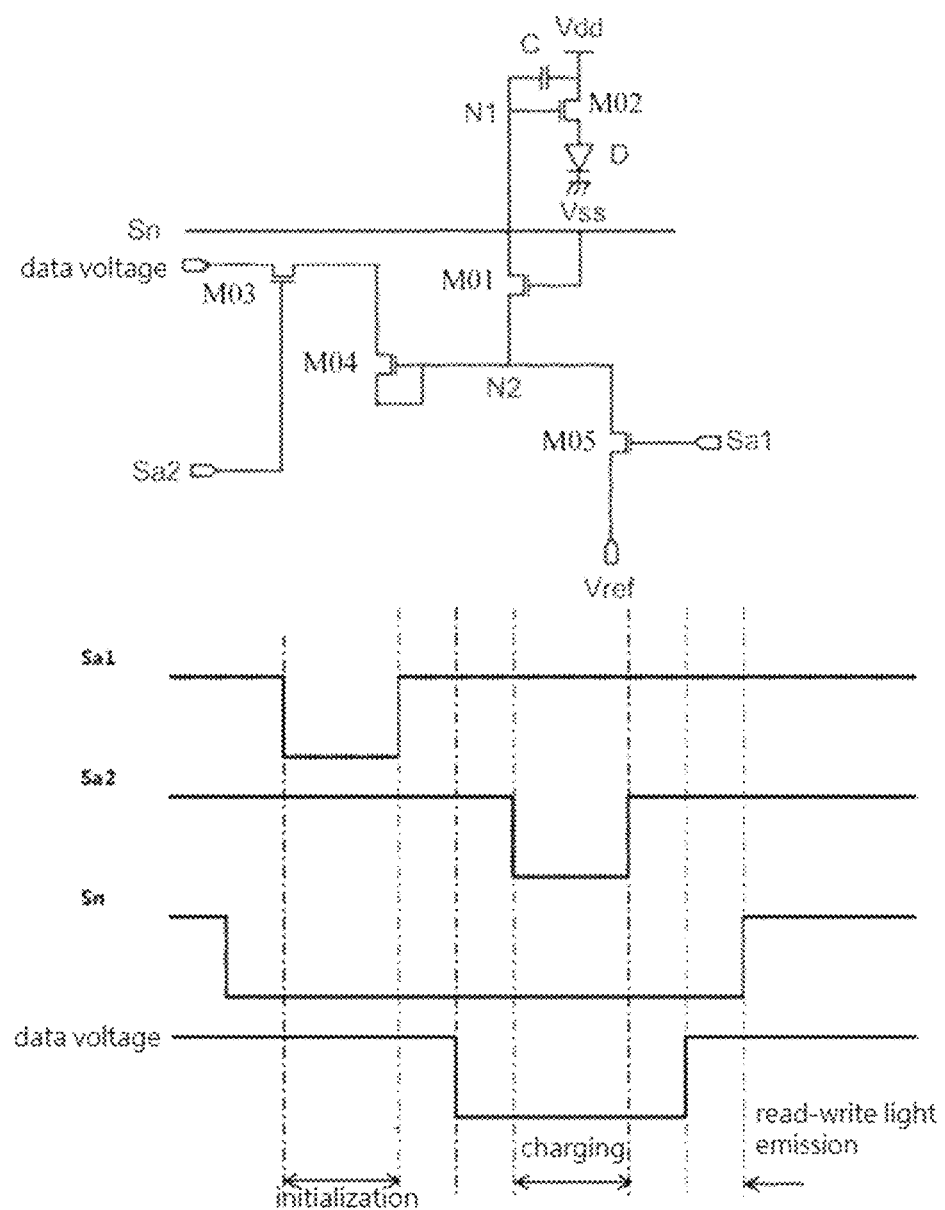
FIG. 4 is a circuit diagram and a corresponding working sequence diagram of another pixel drive circuit of a display panel according to an embodiment of the present disclosure.

FIG. 4 is a circuit diagram and a corresponding working sequence diagram of another pixel drive circuit of a display panel according to an embodiment of the present disclosure.

It can be seen that FIG. 4 shows a 5T1C structure. The pixel drive circuit includes: a zero-first transistor M01, a zero-second transistor M02, a zero-third transistor M03, a zero-fourth transistor M04, a zero-fifth transistor M05, and a storage capacitor C.

The zero-first transistor M01 is connected between a first node N1 and a second node N2, and a gate of M01 is connected to the scan signal line Sn. The zero-second transistor M02 is connected between the power supply voltage VDD and the sub-pixel D, and a gate of M02 is connected to the first node N. The storage capacitor C is connected between the power supply voltage VDD and the first node N1.

The zero-third transistor M03 is connected between the data signal line and a drain of the zero-fourth transistor M04, and a gate of M03 is connected to a second control line Sa2. The zero-fourth transistor M04 is connected between the second node N2 and the drain of the zero-third transistor M03, and a gate of M04 is connected to the second node N2. The zero-fifth transistor M05 is connected between a reference voltage Vref and the second node N2, and a gate of the zero-fifth transistor M05 is connected to a first control line Sa1.

The working sequence of the pixel drive circuit of the 5T1C structure includes an initialization phase, a charging phase, and a read-write light-emission phase.

In the initialization phase, a scan signal provided by the scan signal line Sn is at a low level; a control signal provided by the first control line Sa1 changes from a high level to a low level; a control signal provided by the second control line Sa2 is at a high level; and a data signal Vdata provided by the data line remains at the high level. Since the scan signal provided by the scan signal line Sn is at the low level, the zero-first transistor M01 controlled by the scan signal line Sn is in an on-state; at the same time, since the control signal provided by the first control line Sa1 changes from the high level to the low level, and the zero-fifth transistor M05 controlled by the first control line Sa1 turns from an off-state to an on-state, and the initialization voltage Vref is provided to the first node N1 through the zero-fifth transistor M05 and the zero-first transistor M01, so as to initialize the storage capacitor C by using the reference voltage Vref After the initialization, the voltage of the first node N1 is Vref, i.e., a lower substrate voltage of the storage capacitor C becomes Vref.

In the charging phase, the scan signal provided by the scan signal line Sn remains at a low level; the control signal provided by the second control line Sa2 changes from a high level to a low level; the control signal provided by the first control line Sa1 remains at a high level; and the data signal Vdata provided by the data line remains at a low level. Since the control signal provided by the first control line Sa1 remains at the high level, the zero-fifth transistor M05 is in an off-state, and the initialization voltage Vref cannot be provided to the first node N1 through the zero-fifth transistor M05 and the zero-first transistor M01.

At this moment, since the scan signal provided by the scan signal line Sn remains at the low level, the zero-first transistor M01 controlled by the scan signal line Sn is still in an on-state, and since the control signal provided by the second control line Sa2 changes from the high level to the low level, the zero-third transistor M03 controlled by the second control line Sa2 turns from an off-state to an on-state, the data signal Vdata provided by the data line begins to be written into the sub-pixel D through the zero-third transistor M03. Since the zero-first transistor M01, the zero-third transistor M03, and the zero-fourth transistor M04 are all turned on at this moment, the data signal Vdata provided by the data line is provided to the first node N1 through the zero-third transistor M03, the zero-fourth transistor M04, and the zero-first transistor M01 in sequence. The voltage of the first node N1 begins to rise from Vref. When the voltage of the first node N1 rises to be equal to Vdata−|Vth|, the zero-fourth transistor M04 changes from the on-state to the off-state. Vth is the threshold voltage of the zero-fourth transistor M04.

After the charging is completed, the voltage of the first node N1, i.e., the lower substrate voltage of the storage capacitor C, is equal to Vdata−|Vth|.

In the read-write light-emission phase, the scan signal provided by the scan signal line Sn changes from the low level to the high level; the control signals provided by the first control line Sa1 and the second control line Sa2 are maintained at the high level; and the data signal provided by the data line Vdata is maintained at the high level. Since the scan signal provided by the scan signal line Sn changes from the low level to the high level, the zero-first transistor M01 controlled by the scan signal line Sn changes from the on-state to the off-state; since the control signals provided by the first control line Sa1 and the second control line Sa2 are all maintained at the high level, the zero-fifth transistor M05 controlled by the first control line Sa1 and the zero-third transistor M03 controlled by the second control line Sa2 are both in the off-state. At this moment, the voltage of the first node N1 remains equal to Vdata−|Vth|.

In the phase, since the zero-second transistor M02 is turned on, the zero-second transistor M02 outputs the drive current Ids to the sub-pixel D.

In the above 5T1C structure, the zero-fourth transistor M04 is a sampling transistor, and the zero-second transistor M02 is a drive transistor. The voltage of the data signal line VData collected by the sampling transistor M04 is equal to Vdata−|Vth|, where Vth is the threshold voltage of the sampling transistor M04.

In the charging phase, the source and gate of the zero-fourth transistor M04 are short-circuited, and the transistor becomes a diode.

In the light-emission phase, for the PMOS drive transistor M02, a formula corresponding to the data voltage Vdata and the drive current Ids is as follows:

$$Ids = \frac{W}{2L} \cdot Cox \cdot \mu \cdot (Vsg - |Vth|)^2 =$$
$$\frac{W}{2L} \cdot Cox \cdot \mu \cdot (VDD - (Vdata - |Vth|) - |Vth|)^2 =$$
$$\frac{W}{2L} \cdot Cox \cdot \mu \cdot (VDD - Vdata)^2;$$

where, W is the channel width of the drive transistor; L is the channel length of the drive transistor; Cox is the capacitance constant, i.e., the channel capacitance per unit area of the drive transistor; μ is the carrier mobility, i.e., the average drift rate of carriers in the semiconductor under the unit electric field; VDD is the power supply voltage; Vsg is a source-to-gate voltage; |Vth| is the threshold voltage of the drive transistor M02, which is a negative value.

According to the above formula, under the same gray scale, the width-to-length ratio W/L of the drive transistor M02 of each sub-pixel in same color 11a/11b/11c is in direct proportion to the drive current Ids of the M02, i.e., VDD−Vdata is a fixed value. Since the power supply voltage VDD of each sub-pixel in same color 11a/11b/11c is the same, the data voltage Vdata of each sub-pixel in same color 11a/11b/11c is also the same. In other words, for each sub-pixel in same color 11a/11b/11c, under the same data voltage Vdata, the same gray-scale brightness can be achieved, and the uniform brightness display can be achieved.

In other optional solutions, the pixel drive circuit can also adopt a 4T1C, 4T2C, 5T1C, or 6T1C structure. In the above structure, when the sampling transistor and/or the drive transistor are short-circuited as a diode during a working phase, and the sampling transistor and the drive transistor are not the same transistor, in the solution, the width-to-length ratio of the drive transistor in the pixel drive circuit of each first OLED sub-pixel is changed such that: under the same gray scale, the width-to-length ratio W/L of the drive transistor of each same-color first OLED sub-pixel is in direct proportion to the drive current Ids of the drive transistor.

In the above structure, when the sampling transistor and/or the drive transistor are short-circuited as a diode during a working phase, and the sampling transistor and the drive transistor are the same transistor, or under the same gray scale, and the charging saturation ΔU of the storage capacitor C of each sub-pixel in same color 11a/11b/11c is the same, according to the formula corresponding to the data voltage Vdata and the drive current Ids of the drive transistor, it is first determined that the width-to-length ratio W/L of the drive transistor of each sub-pixel in same color 11a/11b/11c is in direct proportion to the drive current Ids of the drive transistor; then according to the relationship between the charging saturation ΔU of each sub-pixel in same color 11a/11b/11c and the charging voltage of the storage capacitor C during the charging phase, the uniform charging saturation ΔU is achieved by controlling the charging voltage ΔV of each sub-pixel in same color 11a/11b/11c to be uniform; and then the capacitance Cst of the storage capacitor C of each sub-pixel in same color 11a/11b/11c is determined according to that the capacitance Cst of the storage capacitor C is in direct proportion to the drive current Ids when the charging voltage ΔV of each sub-pixel in same color 11a/11b/11c is uniform.

Figure 5:
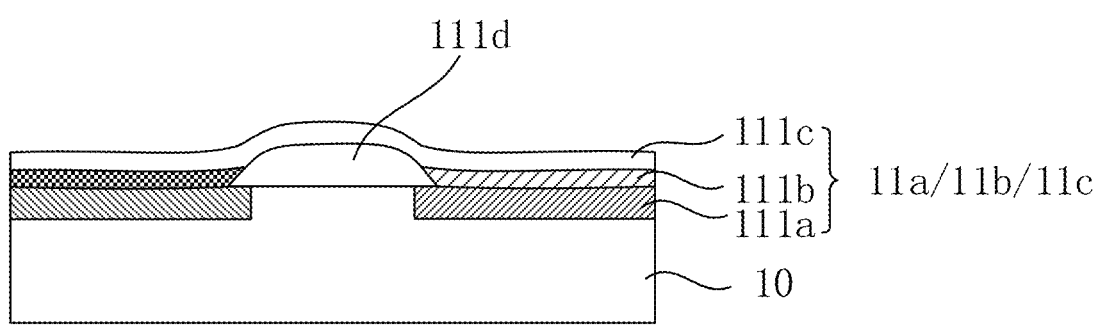
FIG. 5 is a cross-section view taken along a line 5-5 in FIG. 1.

FIG. 5 is a cross-section view taken along a line AA in FIG. 1. Referring to FIGS. 1 and 5, a display panel 1 includes a transparent display area. The transparent display area includes an array of first OLED pixel units 11. Each first OLED pixel unit 11 includes a plurality of first OLED sub-pixels (11a, 11b, 11c), and each first OLED sub-pixel 11a/11b/11c at least includes: a light-transmission anode 111a, an OLED light-emitting material layer 111b located on the light-transmission anode 111a, and a light-transmission cathode 111c located on the OLED light-emitting material layer 111b. When a drive voltage is applied between the light-transmission anode 111a and the light-transmission cathode 111c of each first OLED sub-pixel 111, the array of first OLED pixel units 11 perform a display function; when the drive voltage is not applied between the light-transmission anode 111a and the light-transmission cathode 111c of each first OLED sub-pixel 111, the array of first OLED pixel units 11 perform a light-transmission function.

Referring to FIG. 5, each light-transmission anode 111a can be provided with a pixel definition layer 111d. The pixel definition layer 111d has an opening, and an OLED light-emitting material layer 111b is located in the opening. A substrate 10 of a display panel 1 can be a flexible substrate, such as polyimide, or a rigid substrate, such as glass.

In FIG. 1, the light-transmission anodes 111a in the first OLED pixel units 11 in an array are arranged in one row and multiple columns. In other alternatives, the light-transmission anodes 111a can also be arranged in one column and multiple rows, or arranged in rows and columns. Compared to the block light-transmission anodes arranged in rows and columns, the light-transmission anodes 111a arranged in one row and multiple columns can simplify a pattern in the plane direction due to omitting a pattern between rows, and accordingly can alleviate light diffraction in up and down directions, and thus the light sensor under the transparent display area 10a has a better imaging effect. In a similar way, compared to the block light-transmission anodes arranged in rows and columns, a pattern between columns is omitted in the light-transmission anodes 111a arranged in one column and rows.

Figure 6:
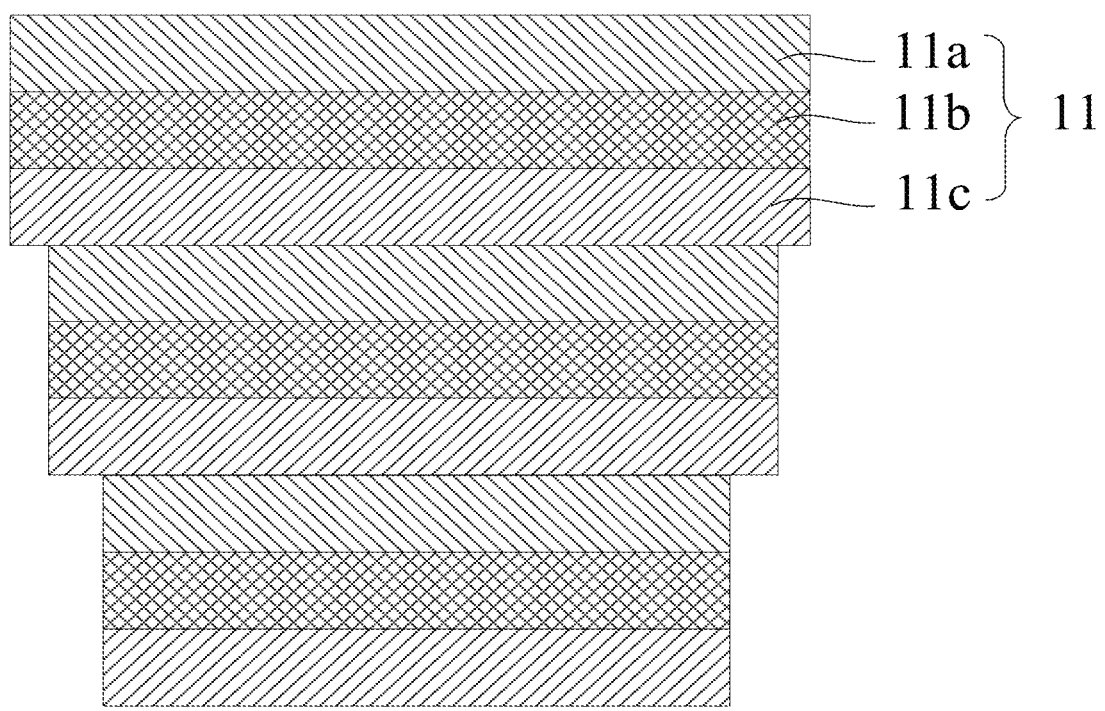
FIG. 6 is an arrangement diagram of a light-transmission anode of each first OLED sub-pixel in a display panel.

Alternatively, each of the first OLED sub-pixels 11a, 11b and 11c has a Passive Matrix (PM) drive mode or an Active Matrix (AM) drive mode. FIG. 6 is another arrangement diagram of light-transmission anodes of first OLED sub-pixels in a display panel. In the embodiment, the transparent display area can be as shown in FIG. 1, which has one row and multiple columns of light-transmission anodes 111a, and the light-transmission cathode 111c is a planar electrode; or as shown in FIG. 6, the transparent display area has one column and multiple rows of light-transmission anodes 111a, and the light-transmission cathode 111c is a planar electrode.

Active Matrix OLED (AMOLED), also referred to as an active matrix type, includes a thin film transistor (TFT) array. Each thin film transistor unit includes a storage capacitor. AMOLED uses an independent thin film transistor to control light emission of each pixel, and each pixel can emit light continuously. In other words, addressing of each OLED sub-pixel is directly controlled by the thin film transistor array. A row selection signal of the thin film transistor array can be derived from a Gate in Panel (GIP) circuit, and a column selection signal can be derived from a Display Driver Integrated Chip (DDIC).

The Passive Matrix OLED (PMOLED), also referred to as a passive drive type, simply forms a matrix with cathodes and anodes, and illuminates the pixels at the intersections of rows and columns in the array by a scanning mode. Each pixel is operated at a short pulse mode, and emits high brightness instantaneously. In other words, the addressing of each OLED sub-pixel is directly controlled by an external circuit.

The display panel shown in FIG. 6 can correspond to a transparent display area with a droplet shape or a fringe shape.

Now the arrangement of light-transmission anodes shown in FIG. 6 is taken as an example, a specific process of determining W/L of the drive transistor and a capacitance Cst of the storage capacitor C in a pixel drive circuit corresponding to the light-transmission anode of each first OLED sub-pixel is described below.

Referring to FIG. 6, from top to bottom, a length of the light-transmission anode 111a of the first OLED sub-pixel 11a/11b/11c in each row gradually decreases.

For a pixel drive circuit in which the sampling transistor and the drive transistor are not short-circuited as diodes in any working phase, such as the 2T1C structure shown in FIG. 1 or the 3T1C structure shown in FIG. 2, a certain row is first set; for example, the width-to-length ratio W/L of the drive transistor X2 of the light-transmission anode 111a of first OLED sub-pixel 11a/11b/11c in the first row is first set.

Since the width-to-length ratio W/L of the drive transistor X2 of the first OLED sub-pixel 11a/11b/11c in each row is in direct proportion to the drive current Ids of the first OLED sub-pixel 11a/11b/11c under the same gray scale, the width-to-length ratio W/L of the drive transistor X2 of the first OLED sub-pixel 11a/11b/11c in each row can be determined according to the drive current Ids of the first OLED sub-pixel 11a/11b/11c in each row under a gray scale, such as 255 gray scale.

For a pixel drive circuit in which the sampling transistor and/or the drive transistor are short-circuited as diodes during a working phase, and the sampling transistor and the drive transistor are the same transistor, for example, the 7T1C structure shown in FIG. 3, a certain row is first set; for example, a width-to-length ratio W/L of the drive transistor M7 of the light-transmission anode 111a of the first OLED sub-pixel 11a/11b/11c in the first row is first set.

Since the width-to-length ratio W/L of the drive transistor M7 of the first OLED sub-pixels 11a/11b/11c in each row is in direct proportion to the drive current Ids of the first OLED sub-pixel 11a/11b/11c under the same gray scale, the width-to-length ratio W/L of the drive transistor M7 of the first OLED sub-pixel 11a/11b/11c in each row can be determined according to the drive current Ids of the first OLED sub-pixel 11a/11b/11c in each row under the same gray scale, such as 255 gray scale.

A certain row is set first; for example, the capacitance Cst of the storage capacitor C of the light-transmission anode 111a of the first OLED sub-pixel 11a/11b/11c in the first row is set.

Since the capacitance Cst of the storage capacitor C of the first OLED sub-pixel 11a/11b/11c in each row is in direct proportion to the drive current Ids of the first OLED sub-pixel 11a/11b/11c under the same gray scale, the capacitance Cst of the storage capacitor C of the first OLED sub-pixel 11a/11b/11c in each row can be determined according to the drive current Ids of the first OLED sub-pixel 11a/11b/11c in each row under the same gray scale, for example, 255 gray scale.

For a pixel drive circuit in which the sampling transistor and/or the drive transistor are short-circuited as diodes during a working phase, and the sampling transistor and the drive transistor are not the same transistor, such as the 5T1C structure shown in FIG. 4, a certain row is set first, for example, the width-to-length ratio W/L of the drive transistor M02 of the light-transmission anode 111a of the first OLED sub-pixel 11a/11b/11c in the first row.

Since the width-to-length ratio W/L of the drive transistor M02 of the first OLED sub-pixel 11a/11b/11c in each row is in direct proportion to the drive current Ids of the first OLED sub-pixel 11a/11b/11c under the same gray scale, the width-to-length ratio W/L of the drive transistor M02 of the first OLED sub-pixel 11a/11b/11c in each row can be determined according to the drive current Ids of the first OLED sub-pixel 11a/11b/11c in each row under the same gray scale, such as 255 gray scale.

In an arc area in FIG. 6, the length of the light-transmission anode 111a of the first OLED sub-pixel 11a/11b/11c in each row decreases from top to bottom. It can be understood that, in order to achieve the same gray scale brightness, the drive current Ids required for the light-transmission anode 111a in each row from top to bottom gradually decreases, and accordingly the width-to-length ratio W/L of the drive transistor X2 in a corresponding pixel drive circuit gradually decreases.

In a similar way, for each column of light-transmission anodes 111a, the width-to-length ratio W/L of the drive transistor X2 in the pixel drive circuit corresponding to the longer light-transmission anode 111a is greater.

Alternatively, each of the first OLED sub-pixels 11a, 11b, and 11c has the PM drive mode. The transparent display area has multiple rows of light-transmission anodes 111a and multiple columns of light-transmission cathodes 111c, or has multiple columns of light-transmission anodes 111a and multiple rows of light-transmission cathodes 111c. The longer the light-transmission anode 111a in each row/column is, the larger the width-to-length ratio W/L of the drive transistor X2 in the corresponding pixel drive circuit is.

Figure 7:
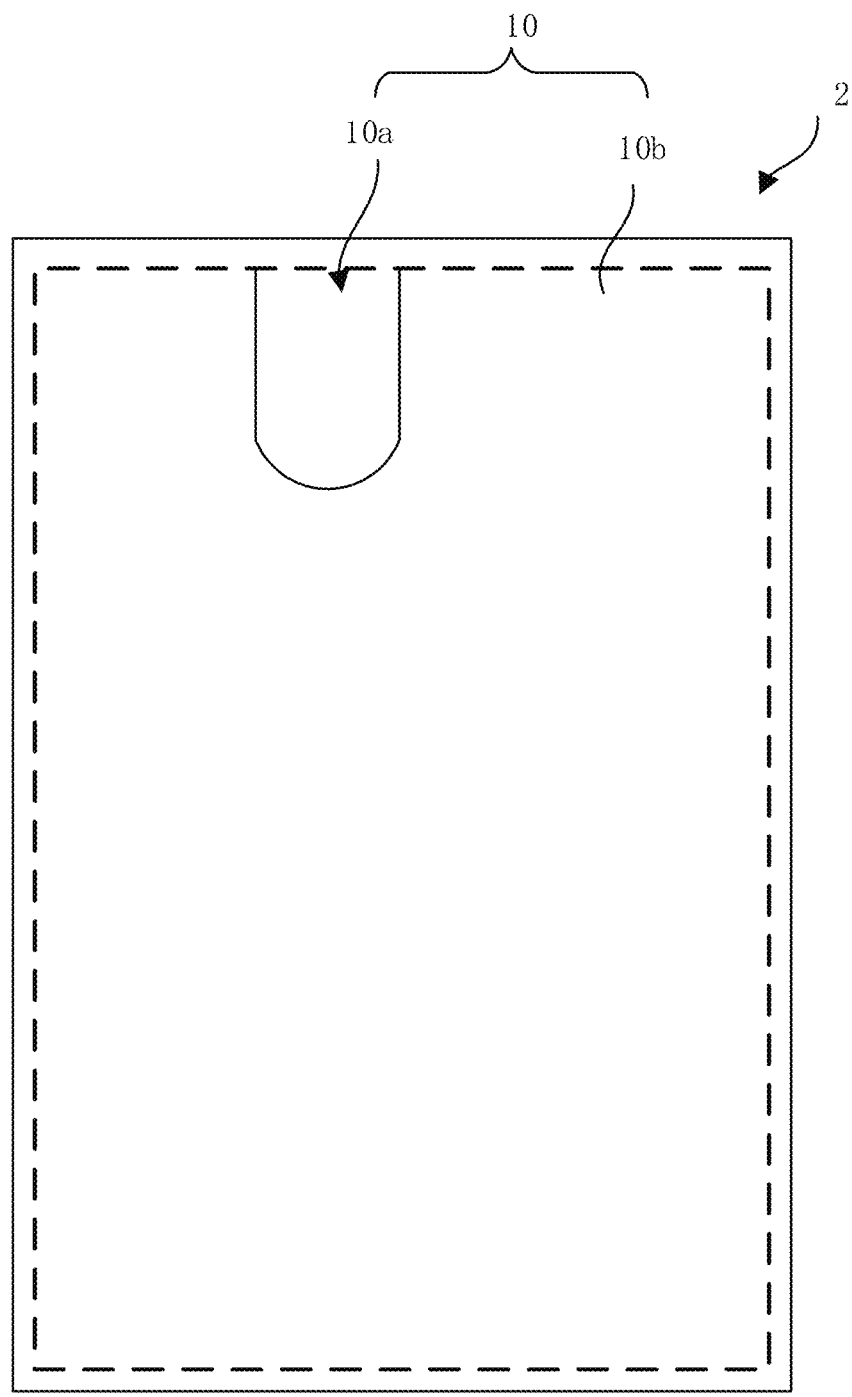
FIG. 7 is a top view of a display panel according to another embodiment of the present disclosure.
Figure 8:
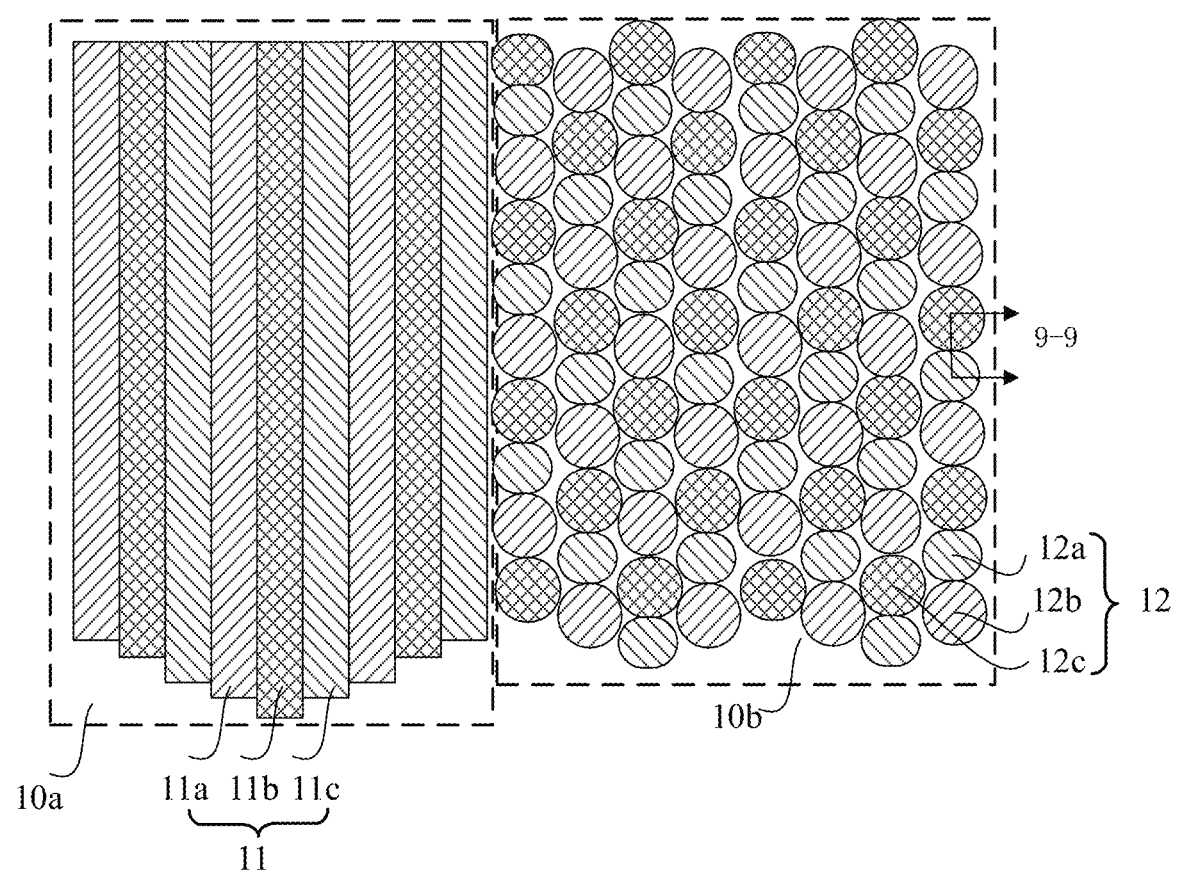
FIG. 8 is an enlarged view of a partial area in FIG. 7.

FIG. 7 is a top view of a display panel in another embodiment of the present disclosure. FIG. 8 is an enlarged view of a partial area in FIG. 7. Referring to FIGS. 7 and 8, the display panel 2 includes a transparent display area 10a and a non-transparent display area 10b. Each of the first OLED sub-pixels 11a, 11b, and 11c in the transparent display area 10a is the same as that of the previous embodiment.

Figure 9:
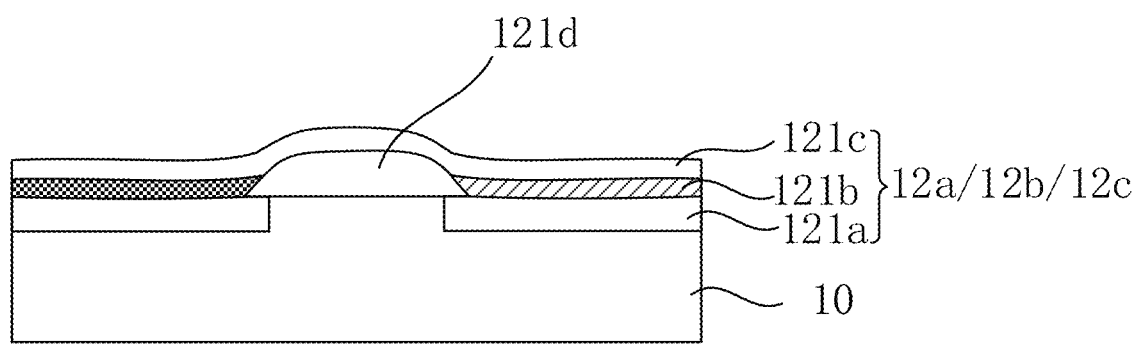
FIG. 9 is a cross-section view taken along a line 9-9 in FIG. 8.

FIG. 9 is a cross-section view taken along a line BB in FIG. 8. Referring to FIGS. 8 and 9, the non-transparent display area 10b includes an array of second OLED pixel units 12. Each second OLED pixel unit 12 includes multiple second OLED sub-pixels 12a, 12b, 12c, and each of the second OLED sub-pixels 12a, 12b, and 12c at least sequentially include, from bottom to top, a reflective anode 121a formed on the substrate 10, a pixel definition layer 121d having an opening, an OLED light-emitting material layer 121b located in the opening, and a light-transmission cathode 121c located on the OLED light-emitting material layer 121b.

In the embodiment, when the sampling transistor and the drive transistor are not short-circuited as diodes in any working phase, for example, in the 2T1C structure shown in FIG. 1 or the 3T1C structure shown in FIG. 2, under the same gray scale, a ratio of the width-to-length ratio W/L of the drive transistor X2 of each first OLED sub-pixel in same color 11a/11b/11c to the drive current Ids is equal to a ratio of the width-to-length ratio W/L of the drive transistor X2 of each second OLED sub-pixel in same color 12a/12b/12c to the drive current Ids.

When the sampling transistor and/or the drive transistor are short-circuited as diodes during a working phase, and the sampling transistor and the drive transistor are the same transistor, for example, in the 7T1C structure shown in FIG. 3, the charging saturation ΔU of the storage capacitor of each first OLED sub-pixel in same color 11a/11b/11c is the same as the charging saturation ΔU of the storage capacitor of each second OLED sub-pixel in same color 12a/12b/12c. A ratio of the width-to-length ratio W/L of the drive transistor of each first OLED sub-pixel in same color 11a/11b/11c to the drive current Ids is equal to a ratio of the width-to-length ratio W/L of the drive transistor of each second OLED sub-pixel in same color 12a/12b/12c to the drive current Ids. A ratio of the capacitance Cst of the storage capacitor C of each first OLED sub-pixel in same color 11a/11b/11c to the drive current Ids is equal to a ratio of the capacitance Cst of the storage capacitor of each second OLED sub-pixel in same color 12a/12b/12c to the drive current Ids.

When the sampling transistor and/or the drive transistor are short-circuited as diodes during a working phase, and the sampling transistor and the drive transistor are not the same transistor, for example, in the 5T1C structure shown in FIG. 4, under the same gray scale, a ratio of the width-to-length ratio W/L of the drive transistor of each first OLED sub-pixel in same color 11a/11b/11c to the drive current Ids is equal to a ratio of the width-to-length ratio W/L of the drive transistor of each second OLED sub-pixel in same color 12a/12b/12c to the drive current Ids.

The embodiment implements that the same data voltage Vdata is applied to each sub-pixel in same color in the transparent display area 10a and the non-transparent display area 10b, and the drive current Ids flowing through each sub-pixel in same color can achieve a display effect of uniform brightness, and accordingly the uniformity of the full-screen display is improved. Compared to a scheme of applying a data voltage Vdata to each sub-pixel in same color in the transparent display area 10a and applying another data voltage Vdata to each sub-pixel in same color in the non-transparent display area 10b, the scheme of the embodiment has low requirements on drive capability of a driver chip; and in the latter scheme, the width-to-length ratio W/L of the drive transistor X2 and the capacitance Cst of the storage capacitor C can be set more flexibly.

Referring to FIG. 8, a pixel density of the transparent display area 10a is less than that of the non-transparent display area 10b. By reducing the pixel density of the transparent display area 10a, film structures of the pixels and the drive circuit can be simplified, and the diffraction under the light transmission function can also be reduced.

Figure 10:
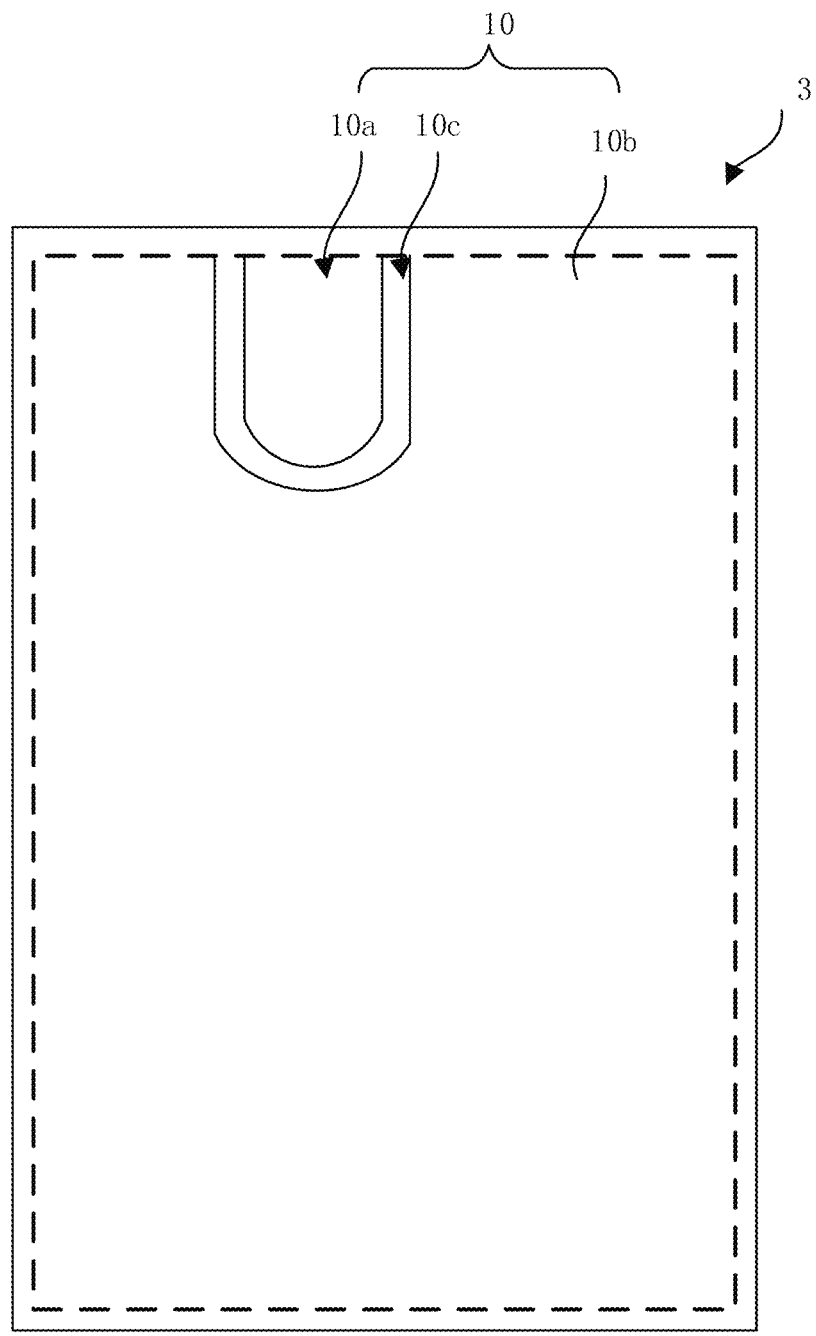
FIG. 10 is a top view of a display panel according to another embodiment of the present disclosure.
Figure 11:
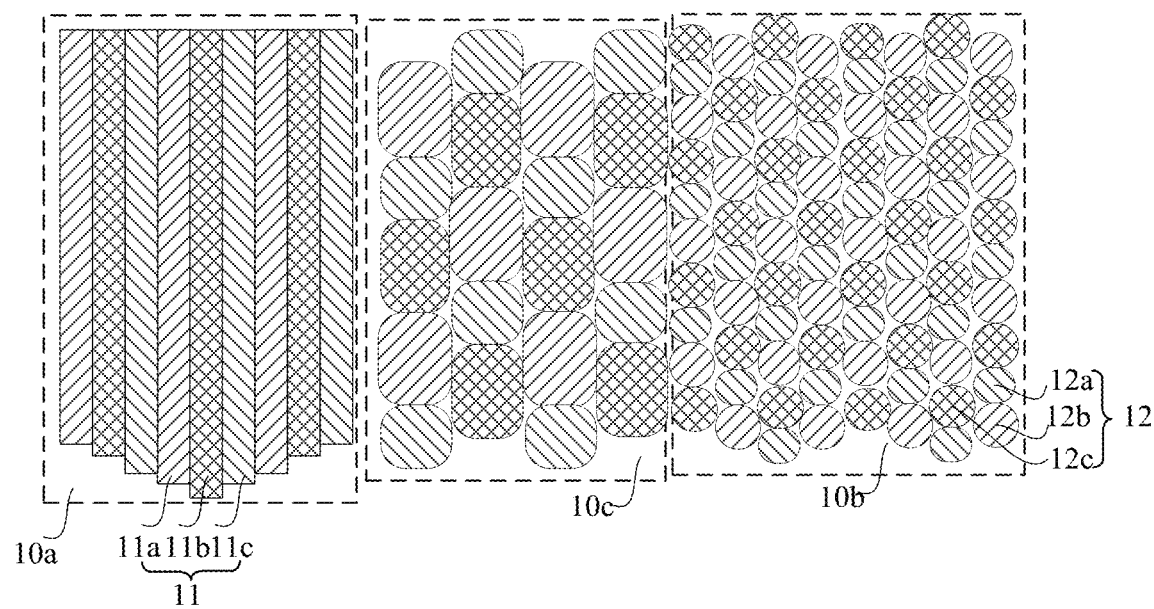
FIG. 11 is an enlarged view of a partial area in FIG. 10.

FIG. 10 is a top view of a display panel according to another embodiment of the present disclosure. FIG. 11 is an enlarged view of a partial area in FIG. 10. Referring to FIGS. 10 and 11, the display panel 3 includes a transparent display area 10a, a non-transparent display area 10b, and a transition area 10c between the transparent display area 10a and the non-transparent display area 10b. Each of the first OLED sub-pixels 11a, 11b and 11c in the transparent display area 10a, and each of the second OLED sub-pixels 12a, 12b and 12c in the non-transparent display area 10b are the same as that of the above-mentioned embodiments. Each of third OLED sub-pixels in the transition area 10c is the same as the second OLED sub-pixel 12a/12b/12c in the above-mentioned embodiment.

When the sampling transistor and the drive transistor are not short-circuited as diodes in any working phase, for example, in the 2T1C structure shown in FIG. 1 or the 3T1C structure shown in FIG. 2, under the same gray scale, a ratio of the width-to-length ratio W/L of the drive transistor of each first OLED sub-pixel in same color 11a/11b/11c to the drive current Ids is equal to a ratio of the width-to-length ratio W/L of the drive transistor of each third OLED sub-pixel in same color to the drive current Ids, but is unequal to a ratio of the width-to-length ratio W/L of the drive transistor of each second OLED sub-pixel in same color 12a/12b/12c to the drive current Ids.

When the sampling transistor and/or the drive transistor are short-circuited as diodes during a working phase, and the sampling transistor and the drive transistor are the same transistor, for example, in the 7T1C structure shown in FIG. 3, under the same gray scale, the charging saturation ΔU of the storage capacitor of each first OLED sub-pixel in same color 11a/11b/11c is the same as the charging saturation ΔU of the storage capacitor of each third OLED sub-pixel in same color, but is different from the charging saturation ΔU of the storage capacitor of each second OLED sub-pixel in same color; a ratio of the width-to-length ratio W/L of the drive transistor of each first OLED sub-pixel in same color 11a/11b/11c to the drive current Ids is equal to a ratio of the width-to-length ratio W/L of the drive transistor of each third OLED sub-pixel in same color to the drive current Ids, but is unequal to a ratio of the width-to-length ratio W/L of the drive transistor of each second OLED sub-pixel in same color to the drive current Ids; a ratio of the capacitance Cst of the storage capacitor of each first OLED sub-pixel in same color 11a/11b/11c to the drive current Ids is equal to a ratio of the capacitance Cst of the storage capacitor of each third OLED sub-pixel in same color to the drive current Ids, but is unequal to a ratio of the capacitance Cst of the storage capacitor of each second OLED sub-pixel in same color to the drive current Ids.

When the sampling transistor and/or the drive transistor are short-circuited as diodes in a working phase, and the sampling transistor and the drive transistor are not the same transistor, for example, in the 5T1C structure shown in FIG. 4, under the same gray scale, a ratio of the width-to-length ratio W/L of the drive transistor of each first OLED sub-pixel in same color 11a/11b/11c to the drive current Ids is equal to a ratio of the width-to-length ratio W/L of the drive transistor of each third OLED sub-pixel in same color to the drive current Ids, but is unequal to a ratio of the width-to-length ratio W/L of the drive transistor of each second OLED sub-pixel in same color 12a/12b/12c to the drive current Ids.

The solution of the embodiment implements that the same data voltage Vdata is applied to each sub-pixel in same color in the transparent display area 10a and the transition area 10c, accordingly the drive current Ids flowing through each sub-pixel in same color achieve a display effect of uniform brightness, and thus uniformity of display in the transparent display area 10a and the transition area 10c can be improved. In addition, the width-to-length ratio W/L of a drive transistor X2 and the capacitance Cst of the storage capacitor C in the transparent display area 10a and the transition area 10c can be set without needing to consider the settings of the width-to-length ratio W/L of a drive transistor and the capacitance Cst of the storage capacitor in the non-transparent display area 10b, and thus respective settings are more flexible.

Alternatively, when the sampling transistor and the drive transistor are not short-circuited as diodes in any working phase, for example, in the 2T1C structure shown in FIG. 1 or the 3T1C structure shown in FIG. 2, under the same gray scale, a ratio of the width-to-length ratio W/L of the drive transistor of each first OLED sub-pixel in same color 11a/11b/11c to the drive current Ids is equal to a ratio of the width-to-length ratio W/L of the drive transistor of each second OLED sub-pixel in same color 12a/12b/12c to the drive current Ids, and is also equal to a ratio of the width-to-length ratio W/L of the drive transistor of each third OLED sub-pixel in same color to the drive current Ids.

When the sampling transistor and/or the drive transistor are short-circuited as diodes during a working phase, and the sampling transistor and the drive transistor are the same transistor, for example, in the 7T1C structure shown in FIG. 3, under the same gray scale, the charging saturation ΔU of the storage capacitor of each first OLED sub-pixel in same color 11a/11b/11c, the charging saturation ΔU of the storage capacitor of each second OLED sub-pixel in same color 12a/12b/12c, and the charging saturation ΔU of the storage capacitor of each third OLED sub-pixel in same color are the same. The ratio of the width-to-length ratio W/L of the drive transistor of each first OLED sub-pixel in same color 11a/11b/11c to the drive current Ids is equal to the ratio of the width-to-length ratio W/L of the drive transistor of each second OLED sub-pixel in same color 12a/12b/12c to the drive current Ids, and is also equal to the ratio of the width-to-length ratio W/L of the drive transistor of each third OLED sub-pixel in same color to the drive current Ids; the ratio of the capacitance Cst of the storage capacitor of each first OLED sub-pixel in same color 11a/11b/11c to the drive current Ids is equal to the ratio of the capacitance Cst of the storage capacitor of each third OLED sub-pixel in same color to the drive current Ids, and is also equal to the ratio of the capacitance Cst of the storage capacitor of each second OLED sub-pixel in same color 12a/12b/12c to the drive current Ids.

When the sampling transistor and/or the drive transistor are short-circuited as diodes during a working phase, and the sampling transistor and the drive transistor are not the same transistor, for example, in the 5T1C structure shown in FIG. 4, under the same gray scale, the ratio of the width-to-length ratio W/L of the drive transistor of each first OLED sub-pixel in same color 11a/11b/11c to the drive current Ids is equal to the ratio of the width-to-length ratio W/L of the drive transistor of each second OLED sub-pixel in same color 12a/12b/12c to the drive current Ids, and is also equal to the ratio of the width-to-length ratio W/L of the drive transistor of each third OLED sub-pixel in same color to the drive current Ids.

The solution of the embodiment implements that the same data voltage Vdata is applied to each sub-pixel in same color in the transparent display area 10a, the transition area 10c, and the non-transparent display area 10b. Accordingly, the drive current Ids flowing through each sub-pixel in same color can achieve the display effect of uniform brightness, and thus the uniformity of the full-screen display is improved.

In the solution of the embodiment, the pixel density of the transparent display area 10a can be less than that of the non-transparent display area 10b; the pixel density of the transition area 10c can be between the pixel density of the transparent display area 10a and the pixel density of the non-transparent display area 10b, to further improve the display effect.

Figure 12:
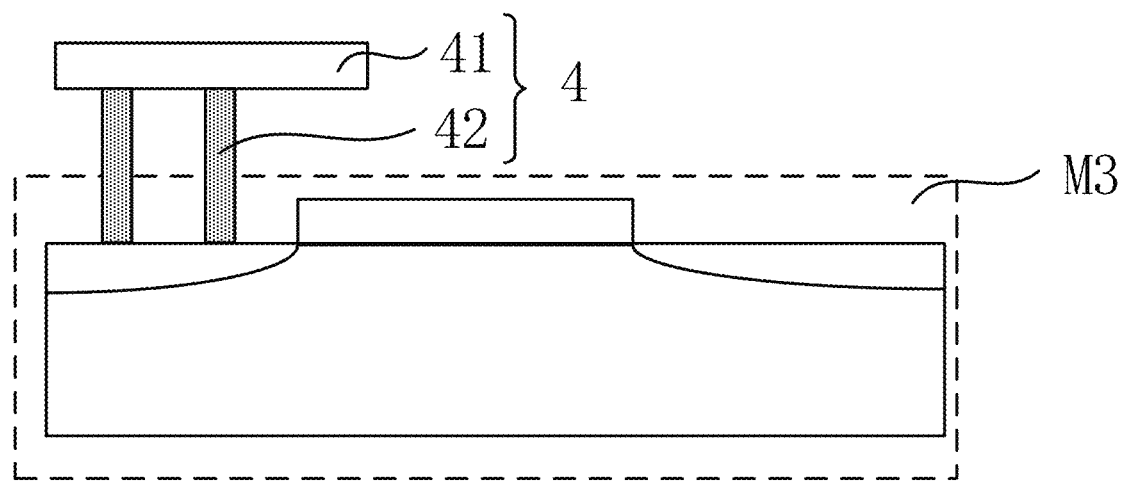
FIG. 12 is a schematic structure diagram illustrating a metal interconnection structure of a first electrode of a third transistor according to an embodiment of the present disclosure.

An electrical connection of the first electrode of the third transistor in the 7T1C structure in FIG. 3 is taken as an example. FIG. 12 is a schematic structure diagram illustrating a metal interconnection structure of a first electrode of a third transistor according to an embodiment of the present disclosure. Referring to FIG. 12, in the pixel drive circuit shown in FIG. 3, the transistors are electrically connected through a metal interconnection structure 4, and the metal interconnection structure 4 includes: a metal interconnection wire pattern 41 and a conductive plug 42.

Referring to FIG. 3, as shown by dotted lines, in the pixel drive circuit and in the light-emission phase, the drive current flows between the first electrode of the third transistor M3 on a path and the metal interconnection wire pattern 41 (shown in FIG. 12), and/or between the first electrode of the seventh transistor M7 and the metal interconnection wire pattern 41, and/or the second electrode of the seventh transistor M7 and the metal interconnection wire pattern 41, and/or between the first electrode of the sixth transistor M6 and the metal interconnection wire pattern 41, and there may be a plurality of conductive plugs 42 therebetween. The plurality refers to two or more.

Compared to one conductive plug 42, the plurality of conductive plugs 42 can reduce the resistance between the source or drain and the metal interconnection wire pattern 41, thereby reducing power consumption of the conductive plugs 42.

In other embodiments, the pixel drive circuit can also be a conventional pixel drive circuit such as having a 2T1C, 3T1C, 4T1C, 4T2C, 5T1C, 6T1C structure, etc. In other pixel drive circuits and in the light-emission phase, there may be a plurality of conductive plugs in the path the drive current flows through, i.e., there may be a plurality of conductive plugs between the source or drain of each transistor between the power supply voltage VDD and the grounding voltage VSS, and the metal interconnection wire pattern, to reduce the resistance between the source or drain and the metal interconnection wire pattern, thereby reducing the power consumption of the conductive plugs.

Alternatively, in the above pixel drive circuit, a range of the width-to-length ratio of the third transistor M3 and/or the sixth transistor M6 and/or the seventh transistor M7 in the path the drive current flows through is 1:1 to 10:1. The greater the width-to-length ratio is set, the more the resistance of the transistor itself can be reduced, and the power consumption of the transistor can also be reduced. In other pixel drive circuits, in the light-emission phase, a range of the width-to-length ratio of a transistor in the path the drive current flows through, i.e., between the power supply voltage VDD and the grounding voltage VSS, can be 1:1 to 10:1, to reduce the resistance of the transistor itself, and the power consumption of the transistor can also be reduced.

Based on the above-mentioned pixel drive circuit, the present disclosure further provides a display panel including the above-mentioned pixel drive circuit.

The above-mentioned pixel drive circuit can also be integrated into the display panel in the embodiments of FIGS. 1 to 11, and the OLED sub-pixel D can be the first OLED sub-pixel 11a, 11b or 11c.

Based on the above-mentioned display panels 1, 2, and 3, the present disclosure further provides a display device.

The display device can be a display device such as a mobile phone, a tablet computer, an in-vehicle display, etc.

The display device includes:
a device body having a device area; and
the above-mentioned display panel 1, 2 or 3 covering the device body;
the device area is located under the transparent display area 10a of the display panel, and a photosensitive device emitting or collecting light through the transparent display area 10a is provided in the device area.

The photosensitive device includes a camera and/or a light sensor. The light sensor includes one or a combination of an iris recognition sensor and a fingerprint recognition sensor.

Although the present disclosure is provided as above, the present disclosure is not limited to this. Any skilled person in the art can make variations and modifications without departing from the spirit and scope of the present disclosure. Therefore, the scope of protection of the disclosure shall be subject to claims.

What is claimed is:

1. A display panel, comprising a plurality of array pixel units, each array pixel unit comprising a plurality of sub-pixels, and a pixel drive circuit of each sub-pixel at least comprising:
   a sampling transistor, configured to collect a data signal voltage and maintain the collected data signal voltage by the storage capacitor;
   a storage capacitor; and
   a drive transistor, configured to receive a current supplied by a power line and provide a drive current to the sub-pixels according to the data signal voltage maintained by the storage capacitor;
   wherein when the sampling transistor and the drive transistor are not short-circuited as diodes in any working phase, a width-to-length ratio of the drive transistor is in direct proportion to the drive current under a same gray scale;
   when the sampling transistor and/or the drive transistor are short-circuited as diodes in a working phase, and the sampling transistor and the drive transistor are not the same transistor, the width-to-length ratio of the drive transistor is in direct proportion to the drive current under the same gray scale; and
   when the sampling transistor and/or the drive transistor are short-circuited as diodes in a working phase, and the sampling transistor and the drive transistor are the same transistor, under the same gray scale, a charging saturation of the storage capacitor of the plurality of sub-pixels in same color is the same, and the width-to-length ratio of the drive transistor and a capacitance of the storage capacitor are both in direct proportion to the drive current; wherein, the charging saturation is a difference value between an actual charging voltage and a theoretical charging voltage of the storage capacitor when a charging phase ends.

2. The display panel according to claim 1, wherein the pixel drive circuit has a 2T1C or 3T1C structure, and the sampling transistor and the drive transistor are not short-circuited as diodes in any working phase.

3. The display panel according to claim 1, wherein the pixel drive circuit has a 4T1C, 4T2C, 5T1C, 6T1C, or 7T1C structure, and the sampling transistor and/or the drive transistor are short-circuited as diodes in a working phase.

4. The display panel according to claim 3, wherein the pixel drive circuit has a 6T1C or 7T1C structure, and the theoretical charging voltage of the storage capacitor at the end of the charging phase is a difference value between the data signal voltage and a threshold voltage of the drive transistor.

5. The display panel according to claim 1, further comprising a transparent display area, wherein the transparent display area comprises a plurality of first Organic Light Emitting Diode (OLED) sub-pixels, and the pixel drive circuit is configured to drive the first OLED sub-pixels in the transparent display area.

6. The display panel according to claim 5, wherein a pixel density of the transparent display area is less than a pixel density of a non-transparent display area.

7. The display panel according to claim 5, wherein each first OLED sub-pixel comprises at least one of a light-transmission anode, an OLED light-emitting material layer located on the light-transmitting anode, or a light-transmission cathode located on the OLED light-emitting material layer, when a drive voltage is applied between the light-transmission anode and the light-transmission cathode of each first OLED sub-pixel, the first OLED sub-pixel performs a display function, and when the drive voltage is not applied between the light-transmission anode and the light-transmission cathode of each first OLED sub-pixel, the first OLED sub-pixel performs a light-transmission function;

each first OLED sub-pixel has a Passive Matrix (PM) drive mode, the transparent display area has a plurality of rows of light-transmission anodes and a plurality of columns of light-transmission cathodes, or has a plurality of columns of light-transmission anodes and a plurality of rows of light-transmission cathodes, and the longer a light-transmission anode in each row/column is, the greater a width-to-length ratio of a drive transistor in a corresponding pixel drive circuit is; or each first OLED sub-pixel has an Active Matrix (AM) drive mode, the transparent display area has one row and a plurality of columns of light-transmission anodes, or has one column and a plurality of rows of light-transmission anodes, a light-transmission cathode is a planar electrode, and the longer the light-transmission anode in each row/column is, the greater the width-to-length ratio of the drive transistor in a corresponding pixel drive circuit is.

8. The display panel according to claim 5 wherein the transparent display area is in a shape of a droplet, a rectangle, a circle, an oval or a fringe.

9. The display panel according to claim 1, further comprising a transparent display area and a non-transparent display area, wherein the transparent display area comprises a plurality of first Organic Light Emitting Diode (OLED) sub-pixels, the non-transparent display area comprises a plurality of second OLED sub-pixels, the pixel drive circuit is configured to drive the first OLED sub-pixels in the transparent display area and the second OLED sub-pixels in the non-transparent display area;

wherein when the sampling transistor and the drive transistor are not short-circuited as diodes in any working phase, under the same gray scale, a ratio of a width-to-length ratio of a drive transistor of each first OLED sub-pixel in same color to the drive current is equal to a ratio of a width-to-length ratio of a drive transistor of each second OLED sub-pixel in same color to the drive current;

when the sampling transistor and/or the drive transistor are short-circuited as diodes in a working phase, and the sampling transistor and the drive transistor are not the same transistor, under the same gray scale, the ratio of the width-to-length ratio of the drive transistor of each first OLED sub-pixel in same color to the drive current is equal to the ratio of the width-to-length ratio of the drive transistor of each second OLED sub-pixel in same color to the drive current; and when the sampling transistor and/or the drive transistor are short-circuited as diodes in a working phase, and the sampling transistor and the drive transistor are the same transistor, a charging saturation of a storage capacitor of each first OLED sub-pixel in same color is the same as a charging saturation of a storage capacitor of each second OLED sub-pixel in same color, the ratio of the width-to-length ratio of the drive transistor of each first OLED sub-pixel in same color to the drive current is equal to the ratio of the width-to-length ratio of the drive transistor of each second OLED sub-pixel in same color to the drive current, a ratio of a capacitance of the storage capacitor of each first OLED sub-pixel in same color to the drive current is equal to a ratio of a capacitance of the storage capacitor of each second OLED sub-pixel in same color to the drive current.

10. The display panel according to claim 1, further comprising a transparent display area, a non-transparent display area, and a transition area between the transparent display area and the non-transparent display area, wherein the transparent display area comprises a plurality of first Organic Light Emitting Diode (OLED) sub-pixels, the non-transparent display area comprises a plurality of second OLED sub-pixels, the transition area comprises a plurality of third OLED sub-pixels, and the pixel drive circuit is configured to drive the first OLED sub-pixels in the transparent display area, the second OLED sub-pixels in the non-transparent display area and the third OLED sub-pixels in the transition area;

when the sampling transistor and the drive transistor are not short-circuited as diodes in any working phase, under the same gray scale, a ratio of a width-to-length ratio of a drive transistor of each first OLED sub-pixel in same color to the drive current is equal to a ratio of a width-to-length ratio of a drive transistor of each third OLED sub-pixel in same color to the drive current, and is different from a ratio of a width-to-length ratio of a drive transistor of each second OLED sub-pixel in same color to the drive current; or under the same gray scale, the ratio of the width-to-length ratio of the drive transistor of each first OLED sub-pixel in same color to the drive current is equal to the ratio of the width-to-length ratio of the drive transistor of each second OLED sub-pixel in same color to the drive current, and is equal to the ratio of the width-to-length ratio of the drive transistor of each third OLED sub-pixel in same color to the drive current;

when the sampling transistor and/or the drive transistor are short-circuited as diodes in a working phase, and the sampling transistor and the drive transistor are not the same transistor, under the same gray scale, the ratio of the width-to-length ratio of the drive transistor of each first OLED sub-pixel in same color to the drive current is equal to the ratio of the width-to-length ratio of the drive transistor of each third OLED sub-pixel in same color to the drive current, and is different from the ratio of the width-to-length ratio of the drive transistor of each second OLED sub-pixel in same color to the drive current; or under the same gray scale, the ratio of the width-to-length ratio of the drive transistor of each first OLED sub-pixel in same color to the drive current is equal to the ratio of the width-to-length ratio of the drive transistor of each second OLED sub-pixel in same color to the drive current, and is equal to the ratio of the width-to-length ratio of the drive transistor of each third OLED sub-pixel in same color to the drive current; and when the sampling transistor and/or the drive transistor are short-circuited as diodes in a working phase, and the sampling transistor and the drive transistor are the same transistor, a charging saturation of a storage capacitor of each first OLED sub-pixel in same color is the same as a charging saturation of a storage capacitor of each third OLED sub-pixel in same color, and is different from a charging saturation of a storage capacitor of each second OLED sub-pixel in same color; the ratio of the width-to-length ratio of the drive transistor of each first OLED sub-pixel in same color to the drive current is equal to the ratio of the width-to-length ratio of the drive transistor of each third OLED sub-pixel in same color to the drive current, and is different from the ratio of the width-to-length ratio of the drive transistor of each second OLED sub-pixel in same color to the drive current; a ratio of a capacitance of the storage capacitor of each first OLED sub-pixel in same color to the drive current is equal to a ratio of a capacitance of the storage capacitor of each third OLED sub-pixel in same color to the drive current, and is different from a ratio of a capacitance of the storage capacitor of each second OLED sub-pixel in same color to the drive current; or under the same gray scale, the charging saturation of the storage capacitor of each first OLED sub-pixel in same color, the charging saturation of the storage capacitor of each second OLED sub-pixel in same color and the charging saturation of the storage capacitor of each third OLED sub-pixel in same color are the same; the ratio of the width-to-length ratio of the drive transistor of each first OLED sub-pixel in same color to the drive current is equal to the ratio of the width-to-length ratio of the drive transistor of each second OLED sub-pixel in same color to the drive current, and is equal to the ratio of the width-to-length ratio of the drive transistor of each third OLED sub-pixel in same color to the drive current; the ratio of the capacitance of the storage capacitor of each first OLED sub-pixel in same color to the drive current is equal to the ratio of the capacitance of the storage capacitor of each third OLED sub-pixel in same color to the drive current, and is equal to the ratio of the capacitance of the storage capacitor of each second OLED sub-pixel in same color to the drive current.

11. The display panel according to claim 10, wherein:
a pixel density of the transparent display area is less than a pixel density of the non-transparent display area and a pixel density of the transition area is between the pixel density of the transparent display area and the pixel density of the non-transparent display area.

12. The display panel according to claim 1, wherein in the pixel drive circuit, a source and a drain of each transistor in a path through which the drive current flows are electrically connected to a metal interconnection wire pattern through a plurality of conductive plugs, and/or a range of the width-to-length ratio of each transistor in the path through which the drive current flows is 1:1 to 10:1; and/or the pixel drive circuit comprises a pixel drive circuit having a 2T1C, 3T1C, 4T1C, 4T2C, 5T1C, 6T1C, or 7T1C structure.

13. The display panel according to claim 1, further comprising a plurality of Organic Light Emitting Diode (OLED) sub-pixels, wherein the pixel drive circuit comprises: a first transistor, a second transistor, a third transistor, a fourth transistor, a fifth transistor, a sixth transistor, a seventh transistor, and a storage capacitor;
a gate of the first transistor is connected to a scan signal line in a pixel row in which a corresponding one of the plurality of OLED sub-pixels is located and a gate of the second transistor, a first electrode of the first transistor is connected to a first electrode of the sixth transistor and a second electrode of the seventh transistor, and a second electrode of the first transistor is connected to a gate of the seventh transistor and a second electrode of the storage capacitor;
a first electrode of the second transistor is connected to a data signal line, and a second electrode of the second transistor is connected to a first electrode of the seventh transistor and a first electrode of the third transistor;
a gate of the third transistor is connected to a gate of the sixth transistor, a first electrode of the third transistor is connected to the first electrode of the seventh transistor, and a second electrode of the third transistor is connected to a first electrode of the storage capacitor;
a gate of the fourth transistor is connected to a scan signal line in a previous pixel row, a first electrode of the fourth transistor is connected to an anode of the corresponding one of the plurality of OLED sub-pixels, and a second electrode of the fourth transistor is connected to an initial voltage signal line and a second electrode of the fifth transistor;
a gate of the fifth transistor is connected to a scan signal line in a previous pixel row, a first electrode of the fifth transistor is connected to the gate of the seventh transistor and the second electrode of the storage capacitor, and the second electrode of the fifth transistor is connected to the initial voltage signal line;
the gate of the sixth transistor is connected to a light-emitting signal line, the first electrode of the sixth transistor is connected to the second electrode of the seventh transistor, and a second electrode of the sixth transistor is connected to the first electrode of the fourth transistor;
the first electrode of the storage capacitor is connected to a power signal line; and
a plurality of conductive plugs are disposed in at least one of the positions between the first electrode of the third transistor and a metal interconnection wire pattern, between the first electrode of the seventh transistor and the metal interconnection wire pattern, between the second electrode of the seventh transistor and the metal interconnection wire pattern, or between the first electrode of the sixth transistor and the metal interconnection wire pattern;
and/or a width-to-length ratio of the third transistor is 1:1 to 10:1, and/or a width-to-length ratio of the sixth transistor is 1:1 to 10:1, and/or a width-to-length ratio of the seventh transistor is 1:1 to 10:1.

14. A display device, comprising:
a device body having a device area, and
a display panel according to claim 1, covering the device body,
wherein the device area is located under a transparent display area of the display panel, and a photosensitive device emitting or collecting light through the transparent display area is provided in the device area.

15. The display device according to claim 14, wherein the photosensitive device comprises a camera and/or a light sensor.

16. A pixel drive circuit of a display panel, comprising:
a sampling transistor configured to collect a data signal voltage;
a storage capacitor configured to maintain a collected data signal voltage;
a drive transistor configured to receive a current supplied by a power line and provide a drive current to a plurality of sub-pixels of the display panel according to the data signal voltage maintained by the storage capacitor;
wherein when the sampling transistor and the drive transistor are not short-circuited as diodes in any working phase, a width-to-length ratio of the drive transistor is in direct proportion to the drive current under a same gray scale;
when the sampling transistor and the drive transistor are short-circuited as diodes in a working phase, and the sampling transistor and the drive transistor are not the same transistor, the width-to-length ratio of the drive transistor is in direct proportion to the drive current under the same gray scale; and when the sampling transistor and the drive transistor are short-circuited as diodes in a working phase, and the sampling transistor and the drive transistor are the same transistor, under the same gray scale, charging saturations of the storage capacitors of the sub-pixels in same color are the same, and the width-to-length ratio of the drive transistor and a capacitance of the storage capacitor are both in direct proportion to the drive current; wherein, the charging saturation is a difference value between an actual charging voltage and a theoretical charging voltage of the storage capacitor when a charging phase is ending.

17. The pixel drive circuit according to claim 16, wherein the pixel drive circuit comprises a pixel drive circuit having a 2T1C, 3T1C, 4T1C, 4T2C, 5T1C, 6T1C, or 7T1C structure.

18. The pixel drive circuit according to claim 16, wherein the pixel drive circuit is further configured to derive a plurality of Organic Light Emitting Diode (OLED) sub-pixels, and the pixel drive circuit comprises: a first transistor, a second transistor, a third transistor, a fourth transistor, a fifth transistor, a sixth transistor, a seventh transistor, and the storage capacitor; and the pixel drive circuit also comprises a metal interconnection wire pattern and a plurality of conductive plugs;

a gate of the first transistor is connected to a scan signal line in a pixel row in which a corresponding one of the plurality of OLED sub-pixels is located and a gate of the second transistor, a first electrode of the first transistor is connected to a first electrode of the sixth transistor and a second electrode of the seventh transistor, and a second electrode of the first transistor is connected to a gate of the seventh transistor and a second electrode of the storage capacitor;

a first electrode of the second transistor is connected to a data signal line, and a second electrode of the second transistor is connected to a first electrode of the seventh transistor and a first electrode of the third transistor;

a gate of the third transistor is connected to a gate of the sixth transistor, a first electrode of the third transistor is connected to the first electrode of the seventh transistor, and a second electrode of the third transistor is connected to a first electrode of the storage capacitor;

a gate of the fourth transistor is connected to a scan signal line in a previous pixel row, a first electrode of the fourth transistor is connected to an anode of the corresponding one of the plurality of OLED sub-pixels, and a second electrode of the fourth transistor is connected to an initial voltage signal line and a second electrode of the fifth transistor;

a gate of the fifth transistor is connected to a scan signal line in a previous pixel row, a first electrode of the fifth transistor is connected to the gate of the seventh transistor and the second electrode of the storage capacitor, the second electrode of the fifth transistor is connected to the initial voltage signal line;

the gate of the sixth transistor is connected to a light-emitting signal line, the first electrode of the sixth transistor is connected to the second electrode of the seventh transistor, and a second electrode of the sixth transistor is connected to the first electrode of the fourth transistor;

the first electrode of the storage capacitor is connected to a power signal line;

the plurality of conductive plugs are disposed in at least one of the positions between the first electrode of the third transistor and the metal interconnection wire pattern, and/or between the first electrode of the seventh transistor and the metal interconnection wire pattern, and/or between the second electrode of the seventh transistor and the metal interconnection wire pattern, and/or between the first electrode of the sixth transistor and the metal interconnection wire pattern;

and/or a range of a width-to-length ratio of the third transistor is 1:1 to 10:1, and/or a range of a width-to-length ratio of the sixth transistor is 1:1 to 10:1, and/or a range of a width-to-length ratio of the seventh transistor is 1:1 to 10:1.

* * * * *